United States Patent
Varanasi

(10) Patent No.: US 9,170,877 B2
(45) Date of Patent: *Oct. 27, 2015

(54) RESOLVING TRAPPING SETS

(71) Applicant: Micron Technology, Inc., Boise, ID (US)

(72) Inventor: Chandra C. Varanasi, Broomfield, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/160,175

(22) Filed: Jan. 21, 2014

(65) Prior Publication Data

US 2014/0201595 A1  Jul. 17, 2014

Related U.S. Application Data

(63) Continuation of application No. 13/545,591, filed on Jul. 10, 2012, now Pat. No. 8,640,002.

(51) Int. Cl.
*G06F 11/10* (2006.01)
*H03M 13/11* (2006.01)
*H03M 13/00* (2006.01)
*H03M 13/39* (2006.01)

(52) U.S. Cl.
CPC ............ *G06F 11/1008* (2013.01); *G06F 11/10* (2013.01); *H03M 13/1111* (2013.01); *H03M 13/1142* (2013.01); *H03M 13/6577* (2013.01); *H03M 13/3994* (2013.01)

(58) Field of Classification Search
CPC ............... G06F 11/10; G06F 11/1008; H03M 13/6577; H03M 13/1142; H03M 13/3994; H03M 13/1111
USPC .......................... 714/758, 772, 776, 780, 786
See application file for complete search history.

(56) References Cited

U.S. PATENT DOCUMENTS

| | | | |
|---|---|---|---|
| 7,738,292 B2 | 6/2010 | Radke | |
| 8,219,878 B1 * | 7/2012 | Varnica et al. | 714/758 |
| 8,245,098 B2 * | 8/2012 | Han et al. | 714/752 |

(Continued)

FOREIGN PATENT DOCUMENTS

TW    201018095 A1    5/2010

OTHER PUBLICATIONS

Koller, C.; Graell i Amat, A.; Kliewer, J.; Costello, D.J., Jr., "Trapping set enumerators for repeat multiple accumulate code ensembles," Information Theory, 2009. ISIT 2009. IEEE International Symposium on , vol., No., pp. 1819,1823, Jun. 28, 2009-Jul. 3, 2009.*
Saejoon Kim, "Trapping Set Error Correction through Adaptive Informed Dynamic Scheduling Decoding of LDPC Codes," Communications Letters, IEEE , vol. 16, No. 7, pp. 1103,1105, Jul. 2012.*

(Continued)

*Primary Examiner* — Cynthia Britt
(74) *Attorney, Agent, or Firm* — Brooks, Cameron & Huebsch, PLLC

(57) ABSTRACT

Apparatuses and methods for resolving trapping sets are provided. One example method can include attempting to decode a codeword using initial values for confidence levels associated with digits of the codeword. For a trapping set, the confidence levels associated with the digits corresponding to a failed parity check are adjusted. The method further includes attempting to decode a codeword using the adjusted value for the confidence levels of the digits corresponding to the failed parity check.

18 Claims, 3 Drawing Sheets

(56) References Cited

U.S. PATENT DOCUMENTS

| | | | |
|---|---|---|---|
| 8,640,002 B1* | 1/2014 | Varanasi | 714/758 |
| 8,700,973 B1* | 4/2014 | Varnica et al. | 714/758 |
| 8,832,532 B2* | 9/2014 | Bolotov et al. | 714/774 |
| 8,935,601 B1* | 1/2015 | Varnica et al. | 714/800 |
| 2007/0234184 A1 | 10/2007 | Richardson | |
| 2008/0052564 A1 | 2/2008 | Yim et al. | |
| 2009/0024905 A1 | 1/2009 | Shalvi et al. | |
| 2009/0319860 A1 | 12/2009 | Sharon et al. | |
| 2010/0088575 A1 | 4/2010 | Sharon et al. | |
| 2010/0241921 A1 | 9/2010 | Gunnam | |
| 2011/0231731 A1 | 9/2011 | Gross et al. | |
| 2011/0320902 A1 | 12/2011 | Gunnam | |
| 2012/0005551 A1 | 1/2012 | Gunnam | |
| 2012/0005552 A1 | 1/2012 | Gunnam | |

OTHER PUBLICATIONS

McGregor et al., "On the Hardness of Approximating Stopping and Trapping Sets in LPDC Codes," Information Theory Workshop, 2007, ITW '07, IEEE, Lake Tahoe, California, Sep. 2-6, 2007, pp. 248-253.

Laendner et al., "LDPC Codes Based on Latin Squares: Cycle Structure, Stopping Set, and Trapping Set Analysis," IEEE Transactions on Communications, vol. 55, No. 2, pp. 303-312, Feb. 2007.

Zhang et al., "Lowering LDPC Error Floods by Postprocessing," Global Telecommunications Conference 2008, IEEE Globecom 2008, New Orleans, LA, USA, Nov. 30, 2008-Dec. 4, 2008, 6 pp.

Kyung et al., "Exhaustive Search for Small Fully Absorbing Set and the Corresponding Low-Error-Floor Decoder," IEEE International Symposium on Information Theory, Austin, TX, USA, Jun. 13, 2010, pp. 739-743.

* cited by examiner

RESOLVING TRAPPING SETS

CROSS-REFERENCE TO RELATED APPLICATION

This application is a Continuation of U.S. application Ser. No. 13/545,591, filed Jul. 10, 2012, to be issued as U.S. Pat. No. 8,640,002 on Jan. 28, 2014, the specification of which is incorporated herein by reference.

TECHNICAL FIELD

The present disclosure relates generally to error correction, and more particularly, to apparatuses and methods for resolving trapping sets.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

Memory is utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

When data is transmitted from one location to another there is the possibility that an error may occur. Errors can also occur over time while data is stored in a memory. There are a number of techniques that can be used to encode data so that an error can be detected and/or corrected. Since data is routinely transmitted to and from memory, and stored therein, memory can employ error correction techniques to attempt to correct data associated with the memory.

One type of error correction involves a low-density parity-check (LDPC) technique. Unencoded, e.g., "raw" data can be encoded into codewords for transmission and/or storage. The codewords can subsequently be decoded to recover the data. However, depending on the nature and extent of errors that occur to the encoded codeword during transit and/or storage, a decoder may not be successful in properly decoding the codeword.

DETAILED DESCRIPTION

Figure 1:
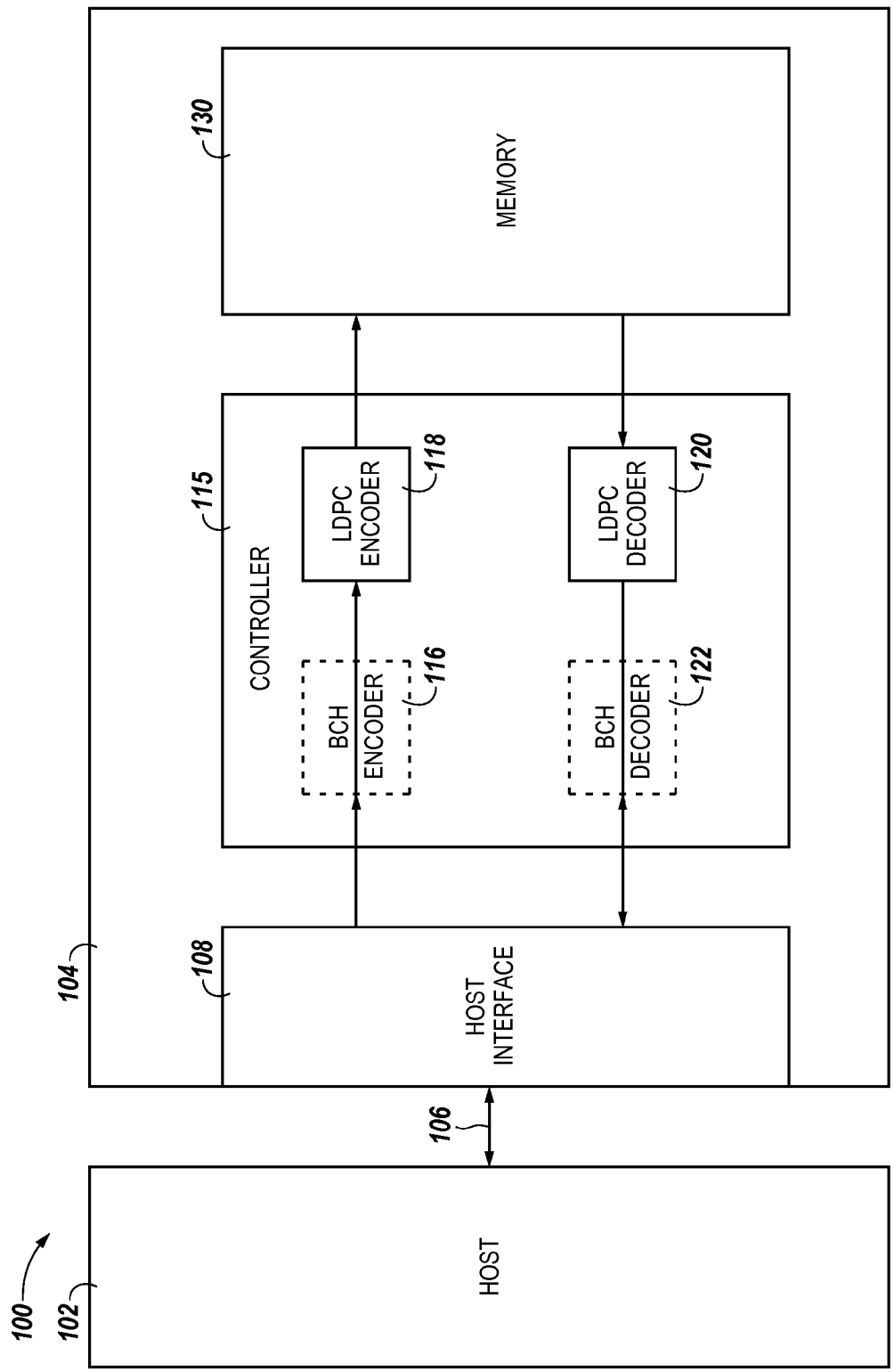
FIG. 1 is a functional block diagram of an apparatus in the form of a computing system including at least one memory system, in accordance with a number of embodiments of the present disclosure.

Apparatuses and methods for resolving trapping sets are provided. One example method can include attempting to decode a codeword using initial values for confidence levels associated with digits of the codeword. For a trapping set, the confidence levels associated with digits corresponding to a failed parity check are adjusted. The method further includes attempting to decode a codeword using the adjusted value for the confidence levels of the digits corresponding to the failed parity check.

Communication channel noise, increases in communication speed, and increases in storage density can each provide opportunities for the introduction of errors to the data being transmitted and/or stored. With particular respect to storage of data in a memory, it has been observed that charge storage memory cells can have a finite endurance. The quantity of data states per memory cell, as well as the quantity of program and erase cycles, can affect the reliability of the data stored therein. For example, the greater the quantity of data states per memory cell and/or the greater the quantity of program/erase cycles to which a memory cell is subjected, the lower reliability of accurately determining the data that was stored by the cell. Programming a memory cell repeatedly and/or repeatedly at relatively higher voltage levels can cause physical degradation of the memory cell resulting in increased likelihood of error introduction.

Increases in errors and/or decreases in reliability can lead to use of stronger error-correction techniques to detect, and/or timely correct, errors, for instance. Algebraic error-correction codes such as Bose, Chaudhuri, and Hocquenghem (BCH) codes can be used to correct a fixed number of errors in data, e.g., data stored in Flash memory devices. Soft data processing error correcting codes, such as low-density parity-check (LDPC) codes, can out-perform BCH codes.

Data can be expressed in a sequence of digits, e.g., bits. Data can further be encoded, for instance, into codewords. The codewords can comprise multiple digits. The digits of a codeword are sometimes referred to herein as code digits, e.g., code bits, so as to distinguish from the digits of the original data.

In attempting to recover correct data from a low-density parity-check (LDPC) encoded codeword, an LDPC decoder may encounter a number of sets that prevent the decoder from properly decoding the encoded codeword. "Sets" refer to groups of digits, such as the digits of a codeword, being evaluated by the decoder. Sets that prevent the decoder from properly decoding the encoded codeword are referred to as a trapping set. For example, the decoder may not being able to converge to a solution that satisfies decoding criteria for a trapping set.

For example, if errors happen at certain locations in the LDPC encoded codeword, the decoder can become "trapped" and may be unable to properly correct the errors. Errors happening at locations in the LDPC encoded codeword refer to errors associated with the respective column numbers of the parity check matrix H of the code.

According to a number of embodiments of the present disclosure, LDPC decoding can initially proceed based on full-confidence sensing of the data state of bits of a codeword. Associating a confidence level to a sensed data state can more completely reflect the uncertainty that may be included in the sensed data state. For example, initial values for confidence levels associated with digits of a codeword, which reflect confidence about a decision regarding a digit value received in a transmission and/or retrieved from a memory, can be set to reflect full confidence in the digit value. This is explained further below with respect to log-likelihood-ratios (LLR). When trapping sets are encountered, the values of confidence levels associated with those digits of a codeword corresponding to a failed parity check can be adjusted to a no confidence value, such as a value midway between the confidence values of the two possible data states For example, if the full confidence value for a codeword digit sensed as a "0" is +1, and the full confidence value for a codeword digit sensed as a "1" is −1, then the no confidence value can be midway between +1 and −1, which is equal to zero (0).

A confidence level set to a no confidence value does not mean an absence of a confidence value, but rather that the confidence value is set to reflect a quantity that does not prefer any particular digit value to another, i.e., a value that does not reflect confidence in the sensed digit being any particular digit value. Thus, the no confidence value can be midway between the full confidence values of respective possible data states. The term "erasure" is sometimes used to mean a 50% probability that the digit is one data state, e.g., "0," and a 50% probability that the digit is a different data state, e.g., "1." Accordingly, the confidence level can be set to a no confidence value associated with erasure.

Full-confidence sensing assumes the sensed data state is accurate. Full-confidence sensing is faster since a probability associated with a sensed data state (such as may be associated with a charge distribution associated with a particular data state) is not considered. Full-confidence sensing is discussed further below. However, the confidence levels associated with digits corresponding to a failed parity checks, e.g., that fail after a number of iterations, are adjusted and decoding proceeds.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that a number of the particular feature so designated can be included with a number of embodiments of the present disclosure.

As used herein, "a number of" something can refer to one or more of such things. For example, a number of memory devices can refer to one or more of memory devices. Additionally, designators such as "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a functional block diagram of an apparatus in the form of a computing system 100 including at least one memory system 104, in accordance with a number of embodiments of the present disclosure. Although the apparatus and methods of the present disclosure are illustrated with respect to a computing system, and more particularly with respect to decoding data read from memory, embodiments of the present disclosure are not so limited and can be implemented in other manners, such as in receiving data transmitted through a communication channel, etc.

As illustrated in FIG. 1, a host 102 can be communicatively coupled to a memory system 104, such as by an interface 106, e.g., a communication channel. As used herein, a memory system 104, a controller 115, or a memory device 130 might also be separately considered an "apparatus." The memory system 104 can be used as a mass data storage memory system in the computing system 100, e.g., an enterprise solid state storage appliance. Alternatively, the memory system 104 can be used as an external, or portable, memory system for computing system 100, e.g., a portable solid state drive (SSD) with plug-in connectivity such as a thumb drive, etc.

The memory system 104 can include a host interface 108, a controller 115 (e.g., a processor and/or other control circuitry), and a memory 130), which provides a storage volume for the memory system 104. The memory 130 can be comprised of a number of memory devices (not individually shown for simplicity), e.g., solid state memory devices such as NAND flash devices. In a number of embodiments, the controller 115, the memory device 130, and/or the host interface 108 can be physically located on a single die or within a single package, e.g., a managed NAND application. Also, in a number of embodiments, a memory can include a single memory device.

Interface 106 can be a cable or bus, such as a serial advanced technology attachment (SATA), peripheral component interconnect express (PCIe), or a universal serial bus (USB), or other interface.

The memory system 104 can include a controller 115 communicatively coupled to memory 130. The controller 115 can be communicatively coupled to a host interface 108, which can be communicatively coupled to the host 102. The host interface 108 can be connected to the interface 106, and include, for example, a compatible connector and/or other receptor for the interface 106. For a number of embodiments, the host interface 108 can be in the form of a standardized interface, such as those listed above, or can be compatible with other connectors and/or interfaces. The host interface 1108 is used to communicate data between the memory 130 and the host 102. For example, the host interface 108 can provide an interface for passing control, address, user data, and other signals between the memory 130 and the host 102.

Host 102 and/or host interface 108 can include a memory access device, e.g., a processor, and/or other computing components. One of ordinary skill in the art will appreciate that "a processor" can intend a number of processors, such as a parallel processing system, a number of coprocessors, etc. Examples of host 102 include a desktop computer, a mobile telephone, a server, a laptop computer, a personal computer, a digital camera, a digital recording and playback device, a personal digital assistant (PDA), a memory card reader, an interface hub, etc.

Memory 130 can be a non-transitory media, and include a number of arrays of memory cells, e.g., non-volatile memory cells. The arrays can be Flash arrays with a NAND architecture, for example. However, embodiments of the present disclosure are not limited to a particular type of memory array or array architecture. The methods and apparatuses of the present disclosure can also be used or implemented with other memory cells, such as memory cells typically used in, for example, DRAM, PCRAM, and/or RRAM memories. The memory 130 can include a number of storage nodes, e.g., groups of memory cells (detail not shown in FIG. 1).

The controller 115 can include logic (including high speed memory) configured for a number of functions such as error correction coding (ECC), performing physical to logical mapping, "in-flight" data buffering, block management, e.g., wear leveling, and communications interfaces with the memory 130. The controller 115 can translate commands received from the host 102 into appropriate commands to accomplish an intended memory operation, and thereby provide a translation layer between the host 102 and the memory 130. Controller 115 can also process host command sequences and associated data, and other data, to the appropriate memory command sequences in order to store and retrieve data, for example.

The controller 115 can communicate with the memory 130 to operate, e.g., read, write, move, program, sense, erase, the memory cells. Thus, controller 115 can manage communications with, and the data stored in, the memory 130. The controller 115 can have circuitry utilizing a number of integrated circuits, as well as other discrete components. In a number of embodiments, the controller 115 can be an application specific integrated circuit (ASIC) coupled to a printed circuit board including the host interface 108, and/or the memory device 130.

The memory system 104, memory 130, and/or controller 115 can include additional circuitry that is not illustrated so as not to obscure embodiments of the present disclosure. For example, although not specifically illustrated, in some embodiments, the memory can include a plurality of components each coupled to the controller 115 by a respective channel. The controller 115 can include a discrete memory channel controller for each channel. The controller 115 can include, for example, a number of components in the form of hardware and/or firmware (e.g., a number of integrated circuits) and/or software for controlling access to the memory 130. As used herein, the memory system 104, the controller 115, or the memory 130 might also be implemented separately and/or considered an "apparatus."

The controller 115 can also include logic configured for encoding and decoding data being transmitted to and/or received from the memory 130. As illustrated in FIG. 1, the controller 115 can include a number of error coding/decoding components, e.g., encoder/decoder implementing an error correction code (ECC) engine. The error coding components can be configured to encode data, e.g., user data, received from the host 102 to be stored in the memory 130.

According to a number of embodiments, the controller 115 can include an encoding portion and/or a decoding portion. For example, the controller 115 can include a low-density parity check (LDPC) encoder 118, an LDPC decoder 120, a BCH (Bose, Chaudhuri, and Hocquenghem) encoder 116, and/or a BCH decoder 122. User data can be encoded using a linear error correcting code such as an LDPC code.

Encoding and/or decoding of the data can be accomplished in hardware and/or software, such as in the controller 115 and/or at the host 102 before communication to the controller 115. Encoders 116/118 receive unencoded data at an input and provided encoded data at an output. Encoders 116/118 can receive, e.g., from a host 102, k digits of data at an input, e.g., a k-digit codeword, and generate n digits of data, e.g., an n-digit encoded codeword at an output. As used herein, a "digit" refers to a digit of data, such as a binary digit, e.g., bit, a hexadecimal digit, etc.

As used herein, a "codeword" refers to a combination of digits of data, such as input data, e.g., user data. A codeword can include a particular amount of data which may correspond to a data transfer size of the memory 130 and/or host 102, for example. A codeword can include additional digits as a result of encoding, such as parity digits, for example. The n-digit encoded codeword can uniquely correspond to the k-digit codeword. The n-digit encoded codeword can be stored in the memory 130 in place of the k-digit codeword.

Decoders 120/122 receive encoded data at an input and provide the original data at an output. Decoders 120/122 can receive, e.g., from memory 130, n digits of data, e.g., an n-digit encoded codeword, at an input, and generate k digits of data, e.g., an k-digit codeword, at an output. The encoding and decoding process can be such that errors in the encoded codeword can be detected and/or corrected during the decoding process.

Although illustrated as components within the controller 115 in FIG. 1, each of the error coding components can be external to the controller 115, or a number of components can be located within the controller 115 and a number of components can be located external to the controller 115.

Figure 2:
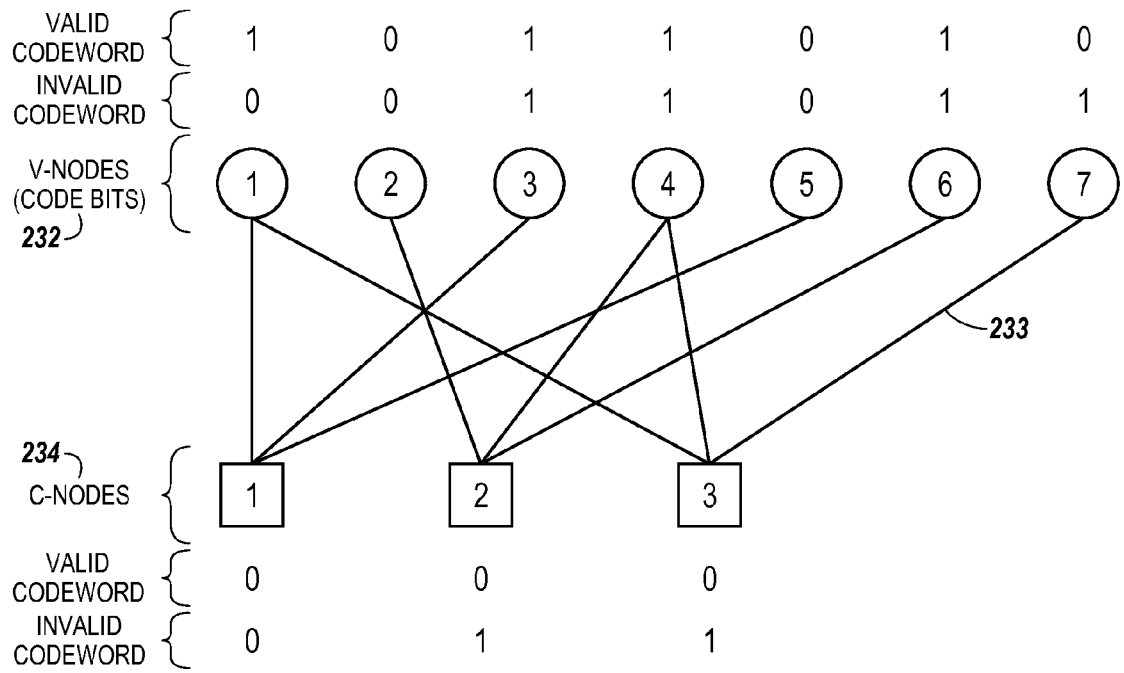
FIG. 2 is a Tanner graph representation for the matrix H, in accordance with a number of embodiments of the present disclosure.

FIG. 2 is a Tanner graph representation for the matrix H, in accordance with a number of embodiments of the present disclosure. Errors that happen at certain locations in a LDPC codeword, such as locations determined by the parity check matrix, H, of the code, can cause the decoder to be trapped. For example, the decoder may not be capable of correcting the errors at all. A technique is discussed below that helps the decoder efficiently recover from such trapping sets.

To protect against errors, a binary data pattern of k bits can be coded into a codeword of n bits, where n>k. The (n−k) redundant bits in the codeword are called parity checks, e.g., parity bits.

A code can be characterized by two matrices, a generator matrix, G, and the parity check matrix, H, of the code.

The (n, k) code can be defined by a unique matrix H of size (n−k)×n, known as its parity check matrix. The entries in matrix H are 1s and 0s. If the count of 1s relative to 0s is low in H, the code is referred to as a low density parity check (LDPC) code. An example of a parity check matrix H for an n-bit codeword (where n=7 as indicated by the quantity of columns in matrix H) and based on 3 parity bits (as indicated by the quantity of rows in matrix H) is shown below:

$$H = \begin{bmatrix} 1 & 0 & 1 & 0 & 1 & 0 & 0 \\ 0 & 1 & 0 & 1 & 0 & 1 & 0 \\ 1 & 0 & 0 & 1 & 0 & 0 & 1 \end{bmatrix}$$

In this example, the codeword is 7 bits long, e.g., n=7, and with 3 parity bits, e.g., (n–k)=3, so the H matrix is a 3×7 matrix, i.e., 3 rows and 7 columns. The data pattern being coded is 4 bits in length, since here the codeword length, n, is 7, and the quantity of parity bits, (n–k), is 3.

The (n, k) code can also be defined by a generator matrix, G, of size k×n. A codeword can be generated from the data pattern being coded using the generator matrix, G. For this example, the generator matrix, G, is a 4×7 matrix, i.e., 4 rows and 7 columns. The generator matrix, G, can be generated from the parity-check matrix, H, or the parity-check matrix H can be generated from the generator matrix, G. The generator matrix, G, for this example is shown below:

$$G = \begin{bmatrix} 0 & 1 & 1 & 1 & 0 & 0 & 0 \\ 1 & 0 & 1 & 0 & 1 & 0 & 0 \\ 1 & 1 & 0 & 0 & 0 & 1 & 0 \\ 1 & 1 & 1 & 0 & 0 & 0 & 1 \end{bmatrix}$$

A data pattern can be chopped-up into 4-bit words, and the words encoded to a codeword using the G matrix. For example [1 0 1 0] can be matrix multiplied with the matrix G to determine the corresponding 7-bit codeword. In this example, the codeword x=[1 0 1 1 0 1 0] results. The codeword can be transmitted and/or stored, e.g., in a memory).

Upon receipt and/or retrieval from memory, the codeword, e.g., [1 0 1 1 0 1 0] for this example, can be checked for validity and used to recover the 4-bit word. One way the codeword can be checked for validity is by matrix multiplication with the transpose matrix of H, i.e., H'. The matrix H' is referred to as H transpose, and is obtained by interchanging the rows and columns of H. The H' matrix for this example is the 7×3 matrix shown below:

$$H' = \begin{bmatrix} 1 & 0 & 0 \\ 0 & 1 & 0 \\ 0 & 0 & 1 \\ 0 & 1 & 1 \\ 1 & 0 & 1 \\ 1 & 1 & 0 \\ 1 & 1 & 1 \end{bmatrix}$$

The matrix multiplication of a valid n-bit codeword, x, with H' should result in an all-zero vector. For this example, matrix multiplication of the 1×7 matrix x with the 7×3 matrix H' results in the 1×3 all-zero vector [0 0 0], which proves that x, e.g., [1 0 1 1 0 1 0], is a valid codeword for this H matrix. The additions in the matrix multiplications discussed herein are modulo 2 additions, also referred to as exclusive-or additions, such that adding 1 plus 1 equals 0 (not 2).

If the matrix multiplication of x and H' does not result in an all-zero vector, such a result indicates the presence of errors in the codeword, i.e., a failed parity check. Errors in a codeword refer to digits of the codeword in certain locations where the digits have been changed, e.g., 0s changed to 1s and 1s to 0s.

Upon failure of a parity check, attempt(s) can be made to decode the codeword using initial values for confidence levels associated with digits of the codeword. If a solution does not converge, resulting in a trapping set, the confidence levels associated with digits corresponding to the failed parity check can be adjusted to a no confidence value, and further attempt(s) can be made to decode the codeword using the adjusted values for the confidence levels of the digits corresponding to the failed parity check. Attempt(s) to decode the codeword refer to a process to correct the error(s) of digit values in the codeword.

The valid codeword above, [1 0 1 1 0 1 0], may be transmitted and/or stored in a memory. However, if digit(s) change during transmission, while stored in memory, and/or upon sensing from memory, the codeword may change, for example, to [1 0 1 0 0 1 0], in which the fourth digit is changed from a "1" to a "0." The codeword [1 0 1 0 0 1 0] matrix multiplied by H' results in the vector [0 1 1], which is not an all-zero vector indicative of a valid codeword. Thus, the codeword [1 0 1 0 0 1 0] is not valid, and error correction measures can be used to decode the codeword, to the valid codeword to which the errors occurred. Illustration of a codeword having errors that result in a trapping set during subsequent iterative error correction measures is not possible for this simple example. However, the ability to correct errors in a codeword can depend on the location and quantity of the erroneous digits in a codeword, which can have more digits than used in this simple example. The locations of digit errors within a codeword that result in a trapping set are referred to as being at trapping set locations.

The matrix H for an n-bit codeword can also be represented graphically by a structure known as the Tanner graph, consisting of n circles and (n–k) squares. In a Tanner graph, each circle represents a column in matrix H (each column corresponding to a bit of the codeword), and each square represents a row in matrix H (each row corresponding to a parity bit). A line is drawn between a square and a circle if there is a 1 in the row that corresponds to that square at the column position denoted by that circle. The Tanner graph representation for the example matrix H provided above is shown in FIG. 2.

The squares are referred to as check nodes 234 (c-nodes) and the circles are referred to as vertices 232 (v-nodes). The v-nodes 232 can also be referred to as code bits, as indicated parenthetically for the v-nodes 232 in FIG. 3. The number of lines exiting a c-node 234 is the degree of that c-node 234. In this example, the degree of each c-node 234 equals three. A c-node 234 is said to be adjacent to a v-node 232 if it is attached to that v-node 232, as indicated in FIG. 2 by a connection 233 therebetween. For example, in FIG. 2, c-node 1 is adjacent v-nodes 1, 3, and 5.

A c-node 234 is said to be satisfied if the modulo-2 sum, i.e., exclusive-or (XOR) addition of two bits, of the bits in the v-node 232 locations that the c-node 234 is connected to in the Tanner graph equals 0. Exclusive-or addition results in a "1" output sum if one, and only one, of the input digits is a "1," and results in a "0" output sum if both of the input digits are "0" or if both of the input digits are "1."

For example, FIG. 2 shows the v-node values for the valid codeword example above. The v-node values are the digits of the codeword, so v-node node 1 has a value of 1, v-node 2 has a value of 0, and so on as shown for the valid codeword [1 0 1 1 0 1 0]. The corresponding c-node values for the valid codeword example are also shown on FIG. 2. The value of c-node 1 is computed as the modulo-2 sum of the v-node values connected to c-node 1, e.g., the value of v-node 1+the value of v-node 3+the value of v-node 5. Using the v-node values, the modulo-2 sum is 1+1+0=0. The value for c-node 2 is equal to 0+1+1=0, and the value for c-node 3 is equal to 1+1+0=0. The computed c-node values are the same as the all-zero vector computed above by matrix multiplication of the valid codeword and H'.

FIG. 2 also shows the v-node values for the invalid codeword example above. The v-node values are the digits of the invalid codeword example previously discussed, so v-node 1 has a value of 1, v-node 2 has a value of 0, and so on as shown for the invalid codeword [1 0 1 0 0 1 0], i.e., with the fourth digit flipped from 1 to 0. The corresponding c-node values for the invalid codeword example are also shown on FIG. 2. The value of c-node 1 (for the invalid codeword) is computed as the modulo-2 sum of the v-node values connected to c-node 1, e.g., the value of v-node 1+the value of v-node 3+the value of v-node 5. Using the v-node values for the invalid codeword, the modulo-2 sum is 1+1+0=0. The value for c-node 2 is equal to 0+0+1=1, and the value for c-node 3 is equal to 1+0+0=1. Again, the computed c-node values are the same as the not-all-zero vector computed above by matrix multiplication of the invalid codeword and H'.

An unsatisfied c-node 234 is said to have failed. If a first quantity (b) of digits in a codeword are erroneously received, and if that results in a second quantity (a) of c-nodes 234 failing, that pair (a, b) is said to be an (a, b) trapping set (assuming it causes the decoder to fail to converge to a solution). For the example above, quantity b is 1 (the quantity of erroneous digits in the codeword) and quantity (a) is 2 (the quantity of failed c-nodes). An example of a possible trapping set is discussed below with respect to FIG. 3.

Figure 3:
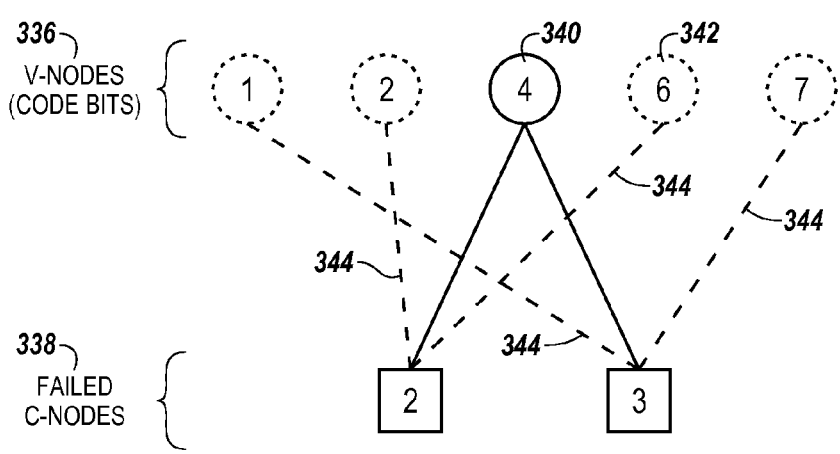
FIG. 3 is a possible trapping set in the Tanner graph representation of FIG. 2, in accordance with a number of embodiments of the present disclosure.

FIG. 3 is a possible trapping set in the Tanner graph representation of FIG. 2, in accordance with a number of embodiments of the present disclosure. The term possible trapping set is used here to denote that single digit error in the invalid codeword may, or may not, cause the decoder to fail to converge to a solution. For this possible trapping set example, bits of the 7-bit codeword (represented by the v-nodes 232 in FIG. 2) in location 4 is in error. The Tanner graph of FIG. 3 is constructed by extracting the erroneous code bit 4, which is indicated in FIG. 3 by the solid circle 340. The connections of c-nodes 338 that are adjacent to those this v-node 336, e.g., 4, are also included in the Tanner graph of FIG. 3. For this example, c-nodes 2 and 3 are adjacent v-node 4, as indicated by the lines connecting c-nodes 2 and 3 to v-node 4 in FIG. 2. Therefore, c-nodes 2 and 3 are shown in the Tanner graph of FIG. 3 as solid boxes, and the connections between c-nodes 2 and 3 and v-node 4 are shown as solid lines.

The Tanner graph of FIG. 3 also includes the other v-nodes connected to the c-nodes 2 and 3. As shown in FIG. 3, c-node 2 is also adjacent to v-nodes 2 and 6, so v-nodes 2 and 6 are shown being attached to c-node 2 by the dotted connections 344. Likewise, c-node 3 is also adjacent to v-nodes 1 and 7, shown by a dotted connection 344 in FIG. 3. The Tanner graph of FIG. 3 shows the failed parity checks (corresponding to the failed c-nodes) and all of the digits of the codeword associated with the failed parity checks. In practice, the computation shown in FIG. 2 can determine which parity checks have failed, from which the digits associated with those failed parity checks that possibly caused the parity check failures can be identified, as shown in FIG. 3.

The erroneous v-nodes 340 are shown in FIG. 3 by solid circles and the correct v-nodes 342 are shown by dotted circles. Both c-nodes 2 and 3 will fail on account of the error in the fourth digit of the codeword, e.g., to code bit 4, even when digits 1, 2, 6, and 7 are correct. Therefore, the Tanner graph of FIG. 3 indicates a (2, 1) possible trapping set for this example, where 2 is the quantity of failing c-nodes 338 (as indicated by the quantity of boxes in the possible trapping set illustrated FIGS. 3) and 1 is the quantity of erroneous bits 340 in the codeword (as indicated by the quantity of solid circles in the possible trapping set illustrated in FIG. 3).

Referring again to FIG. 1, data can be encoded by the LDPC encoder 118, which uses an LDPC code. Accordingly, memory 130 can be programmed using coded data. As such, memory 130 can be sensed, e.g., read, based on coded bits, which are processed by the LDPC decoder 120. According to various embodiments, the LPDC decoder 120 can consider confidence levels associated with sensed digits. That is, a confidence value associated with a sensed digit value can be used in decoding.

Confidence about a decision regarding a digit value can be expressed as log-likelihood-ratio (LLR), which is calculated as $$LLR = \log\left(\frac{P(0)}{P(1)}\right),$$

where P(0) is a probability that a code bit is a first value, e.g., zero, and P(1) is a probability that a code bit is a second value, e.g., one. As such, when full confidence is assigned to a sensed decision, the above formula results in positive infinity when a '0' is sensed since $$LLR = \log\left(\frac{1}{0}\right)$$
$$= \log(\infty)$$
$$= \infty,$$

and negative infinity when a "1" is sensed since $$LLR = \log\left(\frac{0}{1}\right)$$
$$= \log(0)$$
$$= -\infty.$$

The measure of confidence can be truncated to one bit, sending +1 in place of positive infinity and sending −1 in place of negative infinity to the LDPC decoder 120.

Such full-confidence sensing is referred to as 'hard' sensing. That is, the value sensed from the memory 130 is assumed to be the value that was stored in the memory 130. That is, for full-confidence sensing, a code bit that is sensed, e.g., read from memory, as a "0" will have a corresponding LLR of +1, and a code bit that is sensed, e.g., read from memory, as a "1" will have a corresponding LLR of −1. In contrast, "soft" sensing is where a certain measure of doubt about the sensed decision is considered along with the sensed value. Along with sensing the code bits, a probability that a particular sensed code bit is a zero and a probability that the particular sensed code bit is a one is used to compute an LLR associated with the sensed code bit. For example, a code bit may have a 75% probability of actually being in a zero data state and a 25% probability of actually being in a one data state.

Therefore, the associated LLR can be calculated to be:

$$LLR = \log\left(\frac{.75}{.25}\right)$$

= 0.4771

Hard sensing is a preferred mode of sensing memory 130 for throughput reasons since it avoids the computational load and delay to consider probabilities for each state and compute an associated LLR for each sensed bit.

The LLRs of the bits in the trapping set can have the same magnitude as those in the non-erroneous locations even when "soft" sensing is done. After a certain number of iterations, if the LDPC decoder 120 can arrive at a state where the LLRs in trapping set locations have roughly the same magnitude as in the non-erroneous locations, the LDPC decoder 120 will not converge.

Particularly problematic are (a, b) trapping sets, where a<b, that is, the quantity of failed c-nodes is less than the quantity of erroneously-received digits in the codeword. The example discussed above that resulted in a (2,1) possible trapping set is not an (a, b) trapping sets, where a<b. However, in referring back to FIG. 2 one can appreciate that if digits 2 and 6, or 3 and 5, of a codeword were flipped, in each case only one c-node would fail, e.g., c-node 2 and c-node 1 respectively. Each of these scenarios reflects a (1,2) possible trapping set, which are (a, b) trapping sets, where a<b. The examples discussed above are relatively simple in order to illustrate the principles being utilized, which can be applied to more complex scenarios of error correction that can increase as the quantity of digits in a codeword increases.

Some previous approaches for resolving trapping sets relied on first recognizing a trapping set, for example, by comparing a set with an enumeration of all the trapping sets of a code. The greater the quantity of digits in a codeword, the more difficult and time consuming the process becomes for comparing a set being decoded with all possible trapping sets. Furthermore, such previous approaches used memory to maintain a table of such trapping sets so that when the decoder fails, the particular trapping set at which the decoder is stuck and the remedy, e.g., LLR change(s) to apply, can be looked-up. The amount of memory used for maintaining a table for codes is greater as the size of codewords increase, and is increasingly burdensome as the list of trapping sets increases. Use of a table can have drawbacks, such as consuming a significant portion of memory 130, thus reducing the quantity of data that can be stored in memory 130, and/or other drawbacks.

According to a number of embodiments of the present disclosure, the LDPC decoder 120 can implement an iterative decoding process of an n-bit codeword to resolve those trapping sets where the number of failed c-nodes is less than the number of failed v-nodes. According to the embodiments, prior enumeration and/or storing of trapping sets for the LDPC code is not necessary since the method of the present disclosure does not rely on trapping set look-up and/or application of skew to LLRs of a particular trapping set.

If errors happen at trapping set locations, the minimum sum (min-sum) process will not converge. For example, decoding will not succeed, no matter how many iterations are performed. This situation can arise when the LLRs of the bits in the trapping set have the same magnitude as those in the non-erroneous locations. This can occur when "hard" sensing is done of the memory 130, e.g., where sensed 0s have a corresponding LLR of +1 and sensed 1s have a corresponding LLR of −1.

Figure 4:
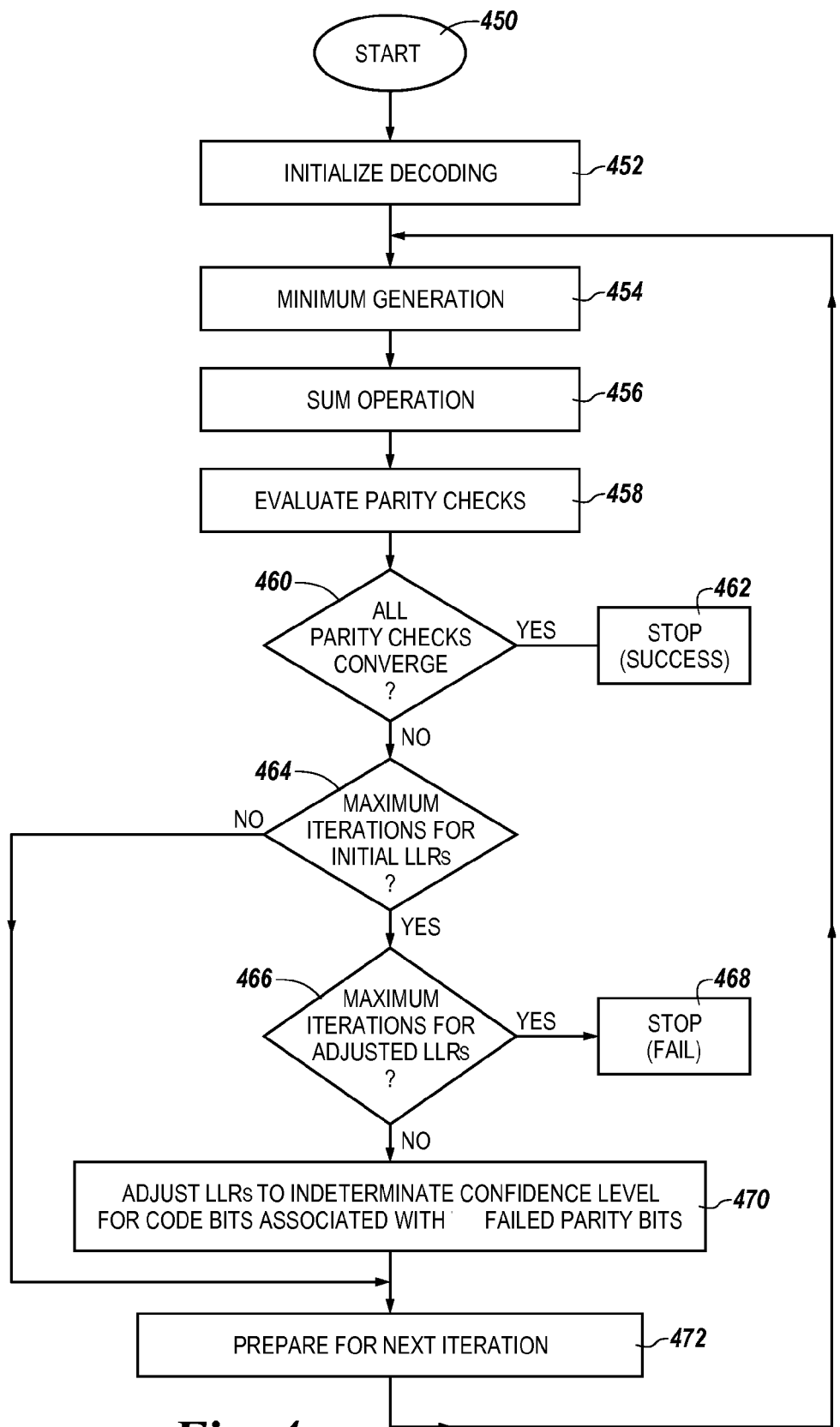
FIG. 4 is a flow chart of a method for resolving trapping sets in accordance with a number of embodiments of the present disclosure.

FIG. 4 is a flow chart of a method for resolving trapping sets in accordance with a number of embodiments of the present disclosure. In a number of embodiments, an LDPC decoder, e.g., 120 in FIG. 1, utilizes an iterative minimum-sum process decoding technique. The flow chart shown in FIG. 4 is discussed using pseudo-code for the iterative decoding process of an n-bit codeword that is given below. MaxIterations is the maximum number of iterations allowed for the LDPC decoder 120 when processing for convergence using initial LLRs. For example, the maximum number of iterations allowed for the LDPC decoder 120 when processing for convergence using initial LLRs can be 10-12 iterations. However, embodiments are not limited to this range and the method of the present disclosure can be implemented using a maximum number of iterations using initial LLRs above, or below, the example range. A maximum number of iterations using initial LLRs can be up to 50, for instance.

The process is initiated at 450. To begin a decoding process, the LDPC decoder is initialized at 452. The LDPC decoder 120 is initialized by receiving, e.g., sensing, the n-bit codeword from memory 130. For example, the codeword n can be an array where CB1 indicates the value of the first sensed code bit as follows:

$$n=[CB1\ CB2\ CB3\ CB4\ CB5\ CB6\ CB7]$$

Initialization continues by:

1. Determining the associated LLRs for each of the n code bits. The LLRs may be stored, e.g., in an array, for the whole n-bit codeword. For example, the array storing the LLRs associated with each code bit, where LLR1 indicates the value of the initial LLR associated with the first sensed code bit, can be as follows:

$$ILLR=[LLR1\ LLR2\ LLR3\ LLR4\ LLR5\ LLR6\ LLR7]$$

2. Initializing a matrix Lq, which is of the same size as matrix H using the received LLRs (for the whole n-bit codeword) as follows:

for i=1: Number of Rows in Lq; and for j=1: n, if H (i,j)=1, set Lq(i,j)=LLR of the jth sensed code bit. For example, for full-confidence sensing the elements of Lq will initially be +1 if a "0" code bit is sensed (and H (i,j)=1) or −1 if a "1" code bit is sensed (and H (i,j)=1) or 0 if H (i,j)=0. For the H matrix discussed previously:

$$Lq = \begin{bmatrix} LLR1 & 0 & LLR3 & 0 & LLR5 & 0 & 0 \\ 0 & LLR2 & 0 & LLR4 & 0 & LLR6 & 0 \\ LLR1 & 0 & 0 & LLR4 & 0 & 0 & LLR7 \end{bmatrix},$$

where the initial LLR values are +/−1, and where LLR1 indicates the LLR for code bit 1, etc. As an example, for the valid codeword example [1 0 1 1 0 1 0] discussed with respect to FIG. 2, and where the measure of confidence is truncated to one bit, sending +1 in place of positive infinity when a '0' is sensed and sending −1 in place of negative infinity when a '1' is sensed, the example initial Lq matrix is as follows:

$$Lq = \begin{bmatrix} -1 & 0 & -1 & 0 & +1 & 0 & 0 \\ 0 & +1 & 0 & -1 & 0 & -1 & 0 \\ -1 & 0 & 0 & -1 & 0 & 0 & +1 \end{bmatrix}$$

3. Initializing a matrix Lr with all zeros (0), where matrix Lr is also of the same size as matrix H.

$$Lr = \begin{bmatrix} 0 & 0 & 0 & 0 & 0 & 0 & 0 \\ 0 & 0 & 0 & 0 & 0 & 0 & 0 \\ 0 & 0 & 0 & 0 & 0 & 0 & 0 \end{bmatrix}$$

4. Initializing variables, e.g., flags, to zero for tracking whether the decoding is successful (DecodeSucceded) and the number of iterations (numIterations) of the decoding process. That is, set DecodeSucceded=0 and numIterations=0.

Processing

After initialization is complete, the iterative decoding process can be performed as follows:

While (DecodeSucceded=0 and numIterations<MaxIterations){

1) Initialize the vector app_llr of length n with the initially determined LLRs, e.g., based on the code bits sensed from memory 130. As an example, for the valid codeword example [1 0 1 1 0 1 0] discussed with respect to FIG. 2, and where the LLR is truncated to one bit, sending +1 in place of positive infinity when a '0' is sensed and sending −1 in place of negative infinity when a '1' is sensed, the example initial app_llr vector is as follows:

app_llr=[−1 +1 −1 −1 +1 −1 +1]

Minimum Generation

As shown in FIG. 4 at 454, minimum values can be generated as follows:

2) Compute the two smallest magnitudes m1 and m2 of all the numbers in each row of matrix Lq; m1 is the smallest and m2 is the next smallest. For the example Lq matrix shown above, m1 and m2 are each −1 (as −1 appears twice in each row).

3) Get the product of the signs S of all the numbers in each row of matrix Lq. For the example Lq matrix shown above, the sign of each row is positive (zero values are taken as having a positive sign). The first row sign, for example, is determined as −x+x−x+x+x+x+=+, which has a positive sign.

4) for i=1: Number of Rows in matrix Lq, and for j=1: n, set Lr (i,j)=sign (Lq (i,j))*S*m1;

or, set Lr (i,j)=sign (Lq (i,j))*S*m2 (if that (i,j) location generated m1). From the example Lq matrix shown above, where S is +, and the values for m1 and m2 are each −1, Lr (1, 1)=−*+*−1=+1, Lr (1, 2)=+*+*−1=−1, . . . Lr (1, 5)=+*+*−1=−1, etc. The resulting Lr matrix becomes:

$$Lr = \begin{bmatrix} +1 & -1 & +1 & -1 & -1 & -1 & -1 \\ -1 & -1 & -1 & +1 & -1 & +1 & -1 \\ +1 & -1 & -1 & +1 & -1 & -1 & -1 \end{bmatrix}$$

Sum Operation

As shown in FIG. 4 at 456, the LLRs associated with respective code bits can be adjusted by addition of a scale factor multiplied by a value based on the generated minimum as follows:

5) For the jth code bit, do the following: (there are n code bits, so 1≤j≤n)

For i=1: number of rows in matrix Lq, compute app_llr (j)=app_llr (j)+scale_factor*Lr (i,j). The scale factor can be a constant that can be determined by instrumentation, for example, in various embodiments the scale factor can be in the range of 0-1. From the Lr matrix immediately above, and a scale_factor of 0.5, for example, app_llr (1)=−1+(0.5)(+1)+(0.5)(−1)+(0.5)(+1)=−0.5, app_llr (2)=+1+(0.5)(−1)+(0.5)(−1)+(0.5)(−1)=+0.5, etc. The app_llr vector becomes:

app_llr=[−0.5 +0.5 −1.5 −0.5 −0.5 −1.5 −0.5]

Decision Making

As shown in FIG. 4 at 458, parity checks can be evaluated for the sensed code bits as follows:

6) For each code bit, use the decision rule: If app_llr (code bit)<0, decision=−1 else, decision=1. For the example app_llr vector above, the decisions are:

1$^{st}$ code bit: decision=−1
2$^{nd}$ code bit: decision=+1
3$^{rd}$ code bit: decision=−1
4$^{th}$ code bit: decision=−1
5$^{th}$ code bit: decision=−1
6$^{th}$ code bit: decision=−1
7$^{th}$ code bit: decision=−1

As shown in FIG. 4 at 460, a determination is made whether the decoder has converged to a solution for all parity checks as follows:

7) Check if all the (n−k) parity checks result in even parity with the decisions made above. Note that the encoded codeword has n bits and the unencoded codeword has k bits, so (n−k) is the quantity of parity bits, which is 3 for matrix H for this example. For each of the (n−k) parity checks, verify even parity by multiplying the decisions made above for column numbers with 1s in matrix H in the row that corresponds to the particular parity check. The example H matrix is:

$$H = \begin{bmatrix} 1 & 0 & 1 & 0 & 1 & 0 & 0 \\ 0 & 1 & 0 & 1 & 0 & 1 & 0 \\ 1 & 0 & 0 & 1 & 0 & 0 & 1 \end{bmatrix}$$

Here, the first row corresponds to the first parity check, the second row to the second parity check, and the third row to the third parity check. The fourth code bit corresponds to the fourth column in the H matrix. The fourth column in the H matrix includes 1's in the second and third rows corresponding to parity checks 2 and 3 (as shown in FIG. 2). For example, for parity check 2, the decisions for the second, fourth and sixth code bits are multiplied together: +1×−1×−1=+1.

That product should result in a value of 1 for that row, as was computed for the second row in the example above. If a value of 1 for all the (n−k) rows is determined, the process is done, so set DecodingSucceded=1 and exit the while loop, as shown in FIG. 4 at 462. That is, the LDPC decoder 120 is run for the allocated maximum number of iterations (MaxIterations) using the initial LLR values, e.g., the +/−1 values based on the sensed value of each code bit. If the LDPC decoder 120 converges within the allocated maximum number of iterations using the initial LLR values, the iterative routine is exited at 462.

If a value of 1 for all the (n−k) rows is not determined, and if numIterations<MaxIterations, i.e., the maximum iterations using initial LLRs, as indicated at 464, then the process proceeds to the preparation of the next iteration 472 (using initial LLR values) detailed below.

Preparation for the Next Iteration

As shown in FIG. 4 at 472, another round of iteration can be prepared for in this way:

8) Update matrix Lq as follows:
   for j=1: number of code bits,
      for i=1: Number of rows in matrix Lq,
         update Lq(i,j)=app_llr(j)−Lr(i,j)
   For example, based on the app_llr vector and Lr matrix as shown below:

$$\text{app\_llr} = [\,-0.5\ +0.5\ -1.5\ -0.5\ -0.5\ -1.5\ -0.5\,]$$

$$Lr = \begin{bmatrix} +1 & -1 & +1 & -1 & -1 & -1 & -1 \\ -1 & -1 & -1 & +1 & -1 & +1 & -1 \\ +1 & -1 & -1 & +1 & -1 & -1 & -1 \end{bmatrix}$$

the updated Lq matrix becomes:

$$Lq = \begin{bmatrix} -1.5 & +1.5 & -2.5 & +0.5 & +0.5 & -0.5 & +0.5 \\ +0.5 & +1.5 & -0.5 & -1.5 & +0.5 & -2.5 & +0.5 \\ -1.5 & 1.5 & -0.5 & -1.5 & +0.5 & -0.5 & +0.5 \end{bmatrix}$$

The next iteration proceeds based on the updated Lq matrix.

9) Update numIterations=numIterations+1.
   }//End of while loop. The decoding process then proceeds as before by repeating all the steps in Processing section.

Branch if Max Iterations

If the maximum number of iterations has been reached then as shown in FIG. 4 at 470 the confidence values, e.g., LLRs, for code bits associated with the failed parity checks are adjusted to a no confidence level, as follows:

A) Determine the failed parity checks by: from matrix H, determine code bits to which each failed parity check is attached as being the column numbers in matrix H with 1s in the row that corresponds to that parity check. Determination of a failed parity check and of the code bits associated with the failed parity checks were discussed with respect to FIGS. 2 and 3. Referring to FIG. 3, the confidence value associated with the fourth code bit can be adjusted to a no confidence level, e.g., 0, before another iteration is executed.

B) For all subsequent iterations, after preparation for the next iteration (shown in FIG. 4 at 472), at the beginning of the iteration, in step 1) of Processing above, the app_llr values are initialized to the adjusted confidence level, e.g., zero which is half way between the two full-confidence levels of +1 and −1, for all those code bits (v-nodes) that were attached to checks (c-nodes) that failed in the previous iteration. For example, app_llr ($4^{th}$ code bit)=0.

The method described above was evaluated experimentally. A particular (18600, 17112) code, i.e., having 18600 codebits or v-nodes and (18600−17112)=1488 c-nodes was taken and 350,000 (6,7) trapping sets were first isolated and tabulated for the code. Note that the number of failed c-nodes is less than the number of failed v-nodes. An all-zero codeword was taken, and in the trapping set locations those zeros were changed to 1s. The LDPC decoder 120 was tested assuming hard sensing of the memory 130. That is, LLRs of +1 were assigned to 0s in the codeword, and LLRs of −1 were assigned to 1s in the codeword. The LDPC decoder 120 failed to converge even after 100 iterations. The procedure described above was invoked with scale-factor of 0.25. The LDPC decoder 120 converged in three iterations or less. The procedure succeeded on all 350,000 trapping sets.

Advantages of the present disclosure include providing the ability to resolve trapping sets that otherwise might not be resolvable without use of a look-up of stored trapping sets and application of skew to LLRs. With more efficient resolution of trapping sets, data can be stored in memory without use of an outer BCH code. Elimination of the outer BCH code can eliminate the need for a BCH encoder 116 and a BCH decoder 122 on the controller 115. That is, according to a number of embodiments, the controller 115 does not include the BCH encoder 116 and/or the BCH decoder 122. Elimination of the outer BCH code can also improve code rate attainable for ECC and thus increases the amount of data stored on a memory device (including through elimination of stored trapping sets for look-up).

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for resolving trapping sets, comprising:
   attempting to decode a codeword using a first value for a confidence level associated with sensed digits of the codeword;
   adjusting, for a trapping set after a failed parity check, the confidence level to a second value reflecting no confidence in a particular digit value of the sensed digits of the codeword; and
   attempting to decode using the sensed digits of the codeword and the second value for the confidence level.

2. The method of claim 1, wherein the second value does not indicate a preference for a particular digit value over another digit value.

3. The method of claim 1, wherein the second value is determined based on full confidence values for different data states of the sensed digits of the codeword.

4. The method of claim 1, wherein the second value reflects a 50% probability that the sensed digits of the codeword is a first data state and a 50% probability that the sensed digits of the codeword is a data state different than the first data state.

5. The method of claim 1, wherein the second value reflects a 50% probability that the sensed digits of the codeword is a first data state and a 50% probability that the sensed digits of the codeword is a second data state.

6. The method of claim 1, wherein the second value is midway between the full confidence values of two possible data states.

7. The method of claim 1, wherein the second value is midway between the full confidence values of respective possible data states.

8. The method of claim 1, wherein the second value is a no confidence value associated with erasure.

9. The method of claim 1, wherein the second value is not an absence of a confidence value.

10. The method of claim 1, wherein attempting to decode a codeword using the first value for the confidence level includes processing the sensed digits of the codeword in a low-density parity-check (LDPC) decoder for a first plurality of iterations that result in at least one failed parity check.

11. A method for resolving trapping sets, comprising:
   initializing a low-density parity-check (LDPC) decoder with initial values of confidence levels for sensed digits of a codeword;
   evaluating a number of parity checks based on the digits of the codeword;
   attempting to correct errors in the sensed digits of the codeword associated with a failed parity check using the initial values of confidence levels;
   adjusting, after a particular number of iterations and for a trapping set, confidence levels associated with the digits of the codeword corresponding to the failed parity check to no confidence values that do not indicate a preference for a particular digit value over another digit value; and
   attempting to decode the codeword using the digits of the codeword corresponding to the failed parity check and the adjusted confidence levels.

12. The method of claim 11, wherein the no confidence value reflects a 50% probability that the digits of the codeword corresponding to the failed parity check are a first data state and a 50% probability that the digits of the codeword corresponding to the failed parity check are a different data state.

13. The method of claim 11, wherein the no confidence value is a value associated with erasure.

14. An apparatus for resolving trapping sets, comprising:
   a memory; and
   a low-density parity-check (LDPC) decoder communicatively coupled to the memory and configured to:
      for a particular number of iterations, attempt to decode a codeword using initial values for confidence levels associated with initial digits of the codeword; and
      after the particular number of iterations, attempt to decode the codeword using digits of the codeword associated with a failed parity check and a no confidence value for the confidence levels associated with digits of the codeword associated with a failed parity check,
   wherein the no confidence value does not reflect confidence in the digit of the codeword corresponding to the failed parity check being a particular digit value.

15. The apparatus of claim 14, wherein the no confidence value does not reflect a preference for a particular digit value of the codeword to another.

16. The apparatus of claim 14, wherein the no confidence value reflects a 50% probability that the digit of the codeword corresponding to the failed parity check is a first data state and a 50% probability that the digit of the codeword corresponding to the failed parity check is a second data state.

17. The apparatus of claim 14, wherein the no confidence value reflects an equal probability for each possible data state for digits of the codeword corresponding to the failed parity check.

18. The apparatus of claim 14, wherein the no confidence value is a value associated with erasure of a memory cell of the memory.

* * * * *